(12) United States Patent
Mathai et al.

(10) Patent No.: US 10,530,129 B2
(45) Date of Patent: Jan. 7, 2020

(54) LOW IMPEDANCE VCSELS

(71) Applicant: HEWLETT PACKARD ENTERPRISE DEVELOPMENT LP, Houston, TX (US)

(72) Inventors: Sagi Mathai, Sunnyvale, CA (US); Michael Renne Ty Tan, Menlo Park, CA (US); Wayne Victor Sorin, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/750,833

(22) PCT Filed: Aug. 10, 2015

(86) PCT No.: PCT/US2015/044482
§ 371 (c)(1),
(2) Date: Feb. 6, 2018

(87) PCT Pub. No.: WO2017/027004
PCT Pub. Date: Feb. 16, 2017

(65) Prior Publication Data
US 2018/0233881 A1 Aug. 16, 2018

(51) Int. Cl.
*H01S 5/00* (2006.01)
*H01S 5/183* (2006.01)
(Continued)

(52) U.S. Cl.
CPC ........ *H01S 5/18377* (2013.01); *H01S 5/0421* (2013.01); *H01S 5/187* (2013.01);
(Continued)

(58) Field of Classification Search
CPC .... H01S 5/187; H01S 5/0421; H01S 5/18305; H01S 5/18313; H01S 5/18341;
(Continued)

(56) References Cited

U.S. PATENT DOCUMENTS 6,185,241 B1 2/2001 Sun
6,304,588 B1 * 10/2001 Chua ................ B82Y 20/00
372/46.013
(Continued)

FOREIGN PATENT DOCUMENTS

CN 101039015 A 9/2007
CN 101136538 A 3/2008
(Continued)

OTHER PUBLICATIONS

Mukaihara, T. et al., "A Novel Birefringent Distributed Bragg Reflector Using a Metal/dielectric Polarizer for Polarization Control of Surface-emitting Lasers," (Research Paper), Jan. 11, 1994, pp. L227-L229.
(Continued)

*Primary Examiner* — Kinam Park
(74) *Attorney, Agent, or Firm* — Sheppard Mullin Richter & Hampton LLP

(57) ABSTRACT

In example implementations of a vertical-cavity surface-emitting laser (VCSEL), the VCSEL includes a p-type distributed Bragg reflector (p-DBR) layer end a p-type ohmic (p-ohmic) contact layer adjacent to the p-DBR layer. The p-DBR layer may include an oxide aperture and the p-ohmic contact layer may have an opening that is aligned with the oxide aperture. The opening may be filled with a dielectric material. A metal layer may be coupled to the p-ohmic contact layer and encapsulate the dielectric material.

8 Claims, 4 Drawing Sheets

(51) Int. Cl.
*H01S 5/042* (2006.01)
*H01S 5/187* (2006.01)
*H01S 5/343* (2006.01)

(52) U.S. Cl.
CPC ...... *H01S 5/18305* (2013.01); *H01S 5/18313* (2013.01); *H01S 5/18341* (2013.01); *H01S 5/18355* (2013.01); *H01S 5/18369* (2013.01); *H01S 5/343* (2013.01); *H01S 2304/02* (2013.01); *H01S 2304/04* (2013.01)

(58) Field of Classification Search
CPC ............. H01S 5/18355; H01S 5/18369; H01S 5/18377; H01S 5/18375; H01S 5/18394; H01S 5/343; H01S 2304/02; H01S 2304/04
See application file for complete search history.

(56) References Cited

U.S. PATENT DOCUMENTS

| | | | |
|---|---|---|---|
| 6,549,556 | B1 | 4/2003 | Hwang et al. |
| 6,611,543 | B2 | 8/2003 | Hwang |
| 7,020,172 | B2 | 3/2006 | Naone et al. |
| 7,286,584 | B2 | 10/2007 | Wang et al. |
| 2003/0235226 | A1* | 12/2003 | Ueki .................. H01S 5/18394 372/46.01 |
| 2007/0091959 | A1* | 4/2007 | Royo .................. H01S 5/18344 372/50.124 |
| 2008/0151961 | A1* | 6/2008 | Kim ...................... H01S 5/0425 372/94 |
| 2010/0014551 | A1 | 1/2010 | Onishi et al. |
| 2013/0034922 | A1* | 2/2013 | Takeda ................ H01S 5/18311 438/31 |
| 2014/0042606 | A1 | 2/2014 | Vo et al. |
| 2014/0112364 | A1 | 4/2014 | Kondo et al. |
| 2015/0162724 | A1* | 6/2015 | Mawst .................. H01S 5/3401 372/45.012 |
| 2017/0373471 | A1* | 12/2017 | Kropp .................... H01L 31/00 |

FOREIGN PATENT DOCUMENTS

| | | |
|---|---|---|
| CN | 101385207 A | 3/2009 |
| CN | 101432936 A | 5/2009 |
| CN | 101765951 A | 6/2010 |
| CN | 102891434 A | 1/2013 |
| CN | 103053036 A | 4/2013 |
| CN | 103563190 A | 2/2014 |
| CN | 104078843 A | 10/2014 |
| CN | 104205527 A | 12/2014 |

OTHER PUBLICATIONS

MD. Jarez Miah et al. Fabrication and Characterization of Low-Threshold Polarization-Stable VCSELs for Cs-Based Miniaturized Atomic Clocks. Feb. 18, 2013, vol. 19, No. 4, p. 1701410.
International Search Report and Written Opinion received for PCT Patent Application No. PCT/US2015/044482, dated Apr. 29, 2016, 11 pages.

* cited by examiner

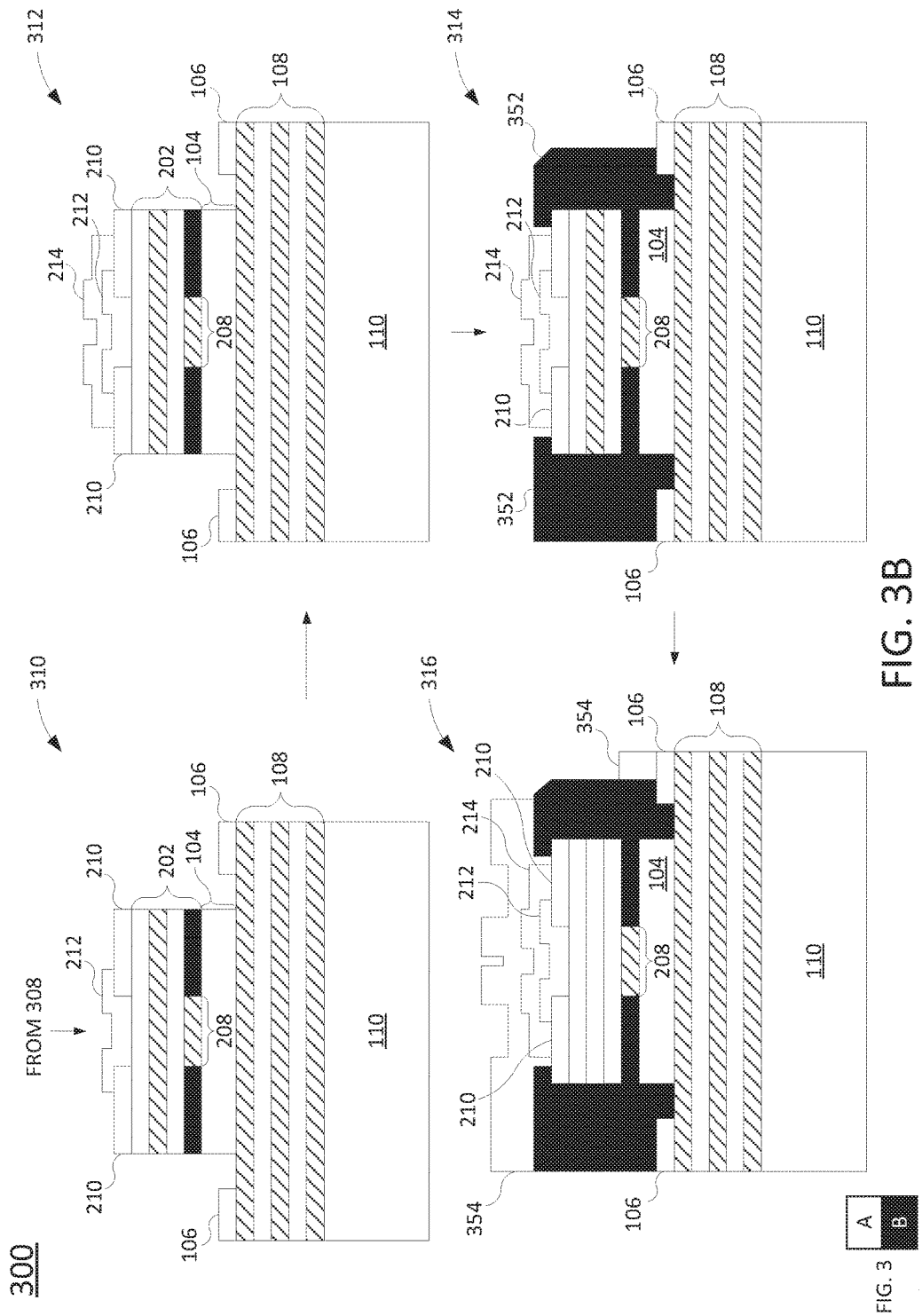

LOW IMPEDANCE VCSELS

BACKGROUND

A vertical-cavity surface-emitting laser (VCSEL) is a type of semiconductor laser diode, VCSELs can be a front/top emitting device or a back/bottom emitting device. For back emitting devices, the VCSEL includes a thick p-type distributed Bragg reflector (p-DBR) that includes greater than 30 alternating metal layers.

BRIEF DESCRIPTION OF THE DRAWINGS

FIGS. 3A and 3B are an example schematic process How of the present disclosure.

DETAILED DESCRIPTION

The present disclosure discloses a new reflective layer for a back emitting VCSEL and method for creating the same. As discussed above, VCSEL is a type of semiconductor light emitting device. VCSELs include a front/top emitting device or a back/bottom emitting device. A back emitting VCSEL is a device that emits fight back through the substrate and not through the top p-DBR layer, The back/bottom emitting device VCSEL usually includes a thick p-type distributed Bragg reflector (p-DBR) that includes greater than 30 alternating high and low refractive index semiconductor layers. A thick p-DBR layer can impact the performance of the VCSEL in a variety of different ways. For example, a thick p-DBR layer can have a large series resistance that leads to a large voltage drop across the p-DBR layer. In addition, high electrical parasitics can limit the bandwidth of the VCSEL. Lastly, a thick p-DBR can have high thermal impedance and high electrical power loss. Consequently, high heat generation in the p-DBR and poor heat extraction through the p-DBR can limit the VCSEL bandwidth and reliability.

Despite these impacts to performance, the thick p-DBR layer is used to achieve a high reflectance. Simply reducing the thickness of the p-DBR layer, by reducing the number of alternating high and low refractive index layers, to avoid the performance impacts described above would result in a degradation of performance of the VCSEL due to the reduction in reflectance of the p-DBR layer.

Example implementations of the present disclosure avoid the performance impacts of the thick p-DBR layer by using a thin p-DBR layer in combination with a dielectric enhanced metal mirror. In addition, the thin p-DBR layer reduces overall costs due to growing less layers and reducing the amount of time to grow the thin p-DBR layer. In one example, the thin p-DBR layer may have less than 30 alternating metal layers used for the p-DBR layer.

In one example, the dielectric enhanced metal mirror may include a dielectric material that fills an opening in the p-type ohmic (p-ohmic) contact layer. The dielectric material may then be covered or encapsulated with a reflective metal. The dielectric enhanced metal mirror may help to achieve an equivalent performance and reflectivity using a thin p-DBR layer compared to using a thick p-DBR layer.

Figure 1:
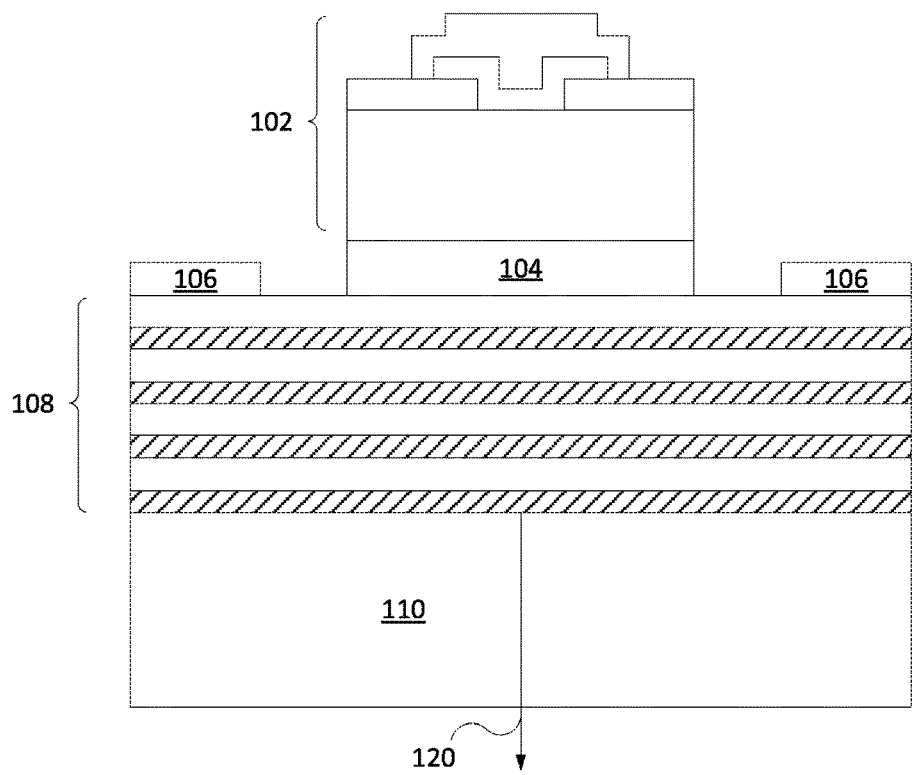
FIG. 1 is a block diagram of an example VCSEL of the present disclosure.

FIG. 1 illustrates an example VCSEL 100 of the present disclosure. The VCSEL 100 may be a back emitting device. In other words, the light emitted by the VCSEL 100 may be reflected by a reflective layer 102 and emitted back through a substrate 110 as illustrated by arrow 120.

In one example, the VCSEL 100 may include the reflective layer 102, a laser cavity layer 104, an n-type distributed Bragg reflector (n-DBR) layer 108 having an n-type ohmic (n-ohmic) contact layer 106 on the substrate 110. In one example, substrate 110 may be a semiconductor. The type of semiconductors used for the substrate 110 may depend on a wavelength desired for the light emitted by the VCSEL 100, such that the particular substrate is transparent at the emission wavelength. For example, desired wavelengths between 850 nanometers (nm) to 1100 nm may use a gallium arsenide (GaAs) substrate. In another example, desired wavelengths between 1300 nm to 1550 nm may use an indium phosphide (InP) substrate. The substrate 110 may be eloped n-type or semi-insulating.

In one implementation, the laser cavity layer 104 may comprise multiple quantum wails and separate confinement heterostructure regions. The n-DBR layer 108 may include alternating layers of a high refractive index layer and a low refractive index layer, in one example, where a GaAs substrate is used, the high and low refractive index layers may include a low and high concentration aluminum layer of aluminum gallium arsenide (AlGaAs), respectively. In one example, a high concentration may be defined as greater than 90% Al. In another example, a high concentration may be defined as approximately 92% Al.

In one implementation, the low concentration may be defined as less than 12% Al. In another-example, a low concentration may be defined as approximately 0% Al. In other examples, if an indium phosphide (InP) substrate is used, the layers may alternate between different high and low refractive layers such as InAlSaAs and InP, respectively.

In one implementation, the n-ohmic contact layer 106 may contain a conductive metal. In some implementations the n-ohmic contact layer 106 may contain layers of different metals. Example metals that may be used in the n-ohmic contact layer 106 may include gold (Au), germanium (Ge) or nickel (Ni). In one example, the n-ohmic contact layer 106 may include a Ge layer, followed by an Au layer, followed by a Ni layer followed by another Au layer.

Figure 2:
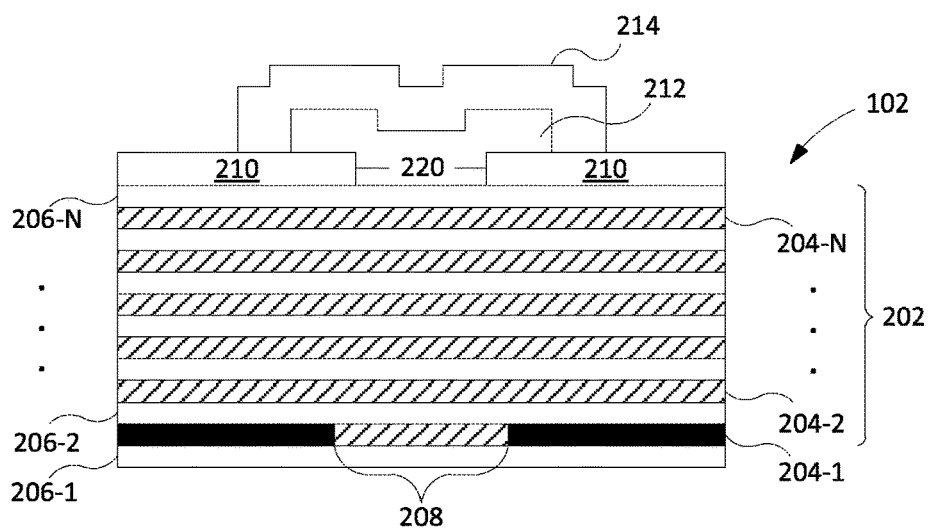
FIG. 2 is an example block diagram of a reflective layer of the example VCSEL of the present disclosure.

FIG. 2 illustrates a more detailed diagram of the reflective layer 102. As described above, the reflective layer 102 of the VCSEL 100 includes a thin p-DBR layer 202 (also-referred to as "p-DBR layer 202"). In one example, thin may be defined as having less than 30 layers.

In some implementations, the p-DBR layer 202 may include alternating layers of a low refractive index layer 204-1, 204-2 to 204-N (herein referred to individually as low refractive index layer 204 or collectively as low refractive-index layers 204) and a high refractive index layer 206-1, 206-2 to 206-N (herein referred to individually as high refractive index layer 206 or collectively as high refractive index layers 206). In one example, when a GaAs substrate is used, the low and high refractive index layers 204 and 206 may include AlGaAs with high and low Al concentration, respectively. In one example, a high concentration may be defined as greater than 90% Al. In another example, a high concentration may be defined as approximately 92% or 98% Al.

In one implementation, the low concentration may be defined as less than 12% Al. In another example, a low concentration may be defined as approximately 0% Al. In other examples, if an InP substrate is used, the layers may alternate between different high and low refractive index layers such as InAlGaAs and InP, respectively.

In one example, a wet oxidation process may selectively oxidize the low refractive index layers 204 in the p-DBR layer 202. Wet oxidation converts AlGaAs info aluminum oxide and the rate of oxidation increases with increasing Al concentration. The low refractive index layers 204 may oxidize much faster than the high refractive index layers 206. The wet oxidation process may oxidize the low refractive index layers 204 from the outside towards a center of the p-DBR layer 202. The wet oxidation process may be applied such that a portion of the low refractive index layers 204 remains un-oxidized to create an oxide aperture 208. Although only a single oxide aperture 208 is illustrated in FIG. 2, it should be noted that there may be more than one oxide aperture 208.

The oxide aperture 208 may define a region in the p-DBR layer 202 where light is confined. The oxide aperture 208 may also restrict the current that is sent to the VCSEL 100 to the vicinity of the oxide aperture 208.

In one implementation, a p-type ohmic (p-ohmic) contact layer 210 may be applied adjacent to the p-DBR layer. The p-ohmic contact layer 210 may comprise a metal. In some implementations, the p-ohmic contact layer 210 may comprise a plurality of layers of different metals. For example, the p-ohmic contact layer 210 may be a titanium (Ti) layer followed by a platinum (Pt) layer followed by a gold (Au) layer.

In some examples, the p-ohmic contact layer 210 may include an opening 220. The opening 220 may be in a center of the p-ohmic contact layer 210. In another example, the opening 220 may be aligned with the oxide aperture 208. Said another way, the p-ohmic contact layer 210 may look like a "donut" shape or a ring shape when looking at a top view of the p-ohmic contact layer 210.

In one example, the opening 220 of the p-ohmic contact layer 210 may be filled with a dielectric material 212. The dielectric material 212 may be any material that has a refractive index less than 2. In one example, the dielectric material 212 may be electrically insulating and optically transparent oxides and nitrides. Some examples of oxides or nitrides that may be used as the dielectric material 212 may include silicon dioxide ($SiO_2$) or silicon nitride ($Si_3N_4$). In another example, the dielectric material 212 may be any type of transparent conductive material. Examples of transparent conductive materials may include certain metal oxides and nitrides. In an alternate implementation, the dielectric material 212 may be air. In this case, the metal layer 214 may be suspended above the p-DBR layer.

In some implementations, the dielectric material 212 may be filled to be less than, equal to, or greater than, a height of the p-ohmic contact layer 210. In other implementations, the dielectric material 212 may be over flowed so that the dielectric material 212 fills, or partially fills, the opening 220 and sits on top of the p-ohmic contact layer 210 for ease of manufacturing.

In one example, the thickness of the dielectric material 212 may be a function of an intended lasing wavelength of the VCSEL 100. For example, the thickness of the dielectric material 212 may be approximately one quarter of the intended lasing wavelength of the VCSEL 100. Mathematically, the thickness may be expressed as thickness~a lasing wavelength/(4*n_dielectric material) where n_dielectric material represents a refractive index of the dielectric material 212, In one example, a metal layer 214 may be applied over the dielectric material 212 to encapsulate the dielectric material 212. The metal layer 214 may be used to seal the dielectric material 212 from the outside environment Alternatively, the metal layer 214 may partially or completely cover the dielectric material 212. The metal layer 214 may include metals such as, but not limited to, Au, Al, copper (Co) or silver (Ag). In some examples, an optically thin adhesion layer such as Ti may be applied to improve the adhesion between the metal layer 214 and the dielectric material 212. In some examples, a diffusion barrier, such as Pt, may be applied between the metal layer 214 and the p-ohmic contact 210.

In other examples, the dielectric material 212 and/or metal layer 214 may be patterned to enhance the reflectivity of a particular polarization of light. For example, the metal layer 214 may be patterned as linear arrays of lines much like a wire grid polarizer. In other implementations, the dielectric layer 212 may be designed as a DBR with high refractive index dielectric materials and low refractive index dielectric materials.

Figure 3A:
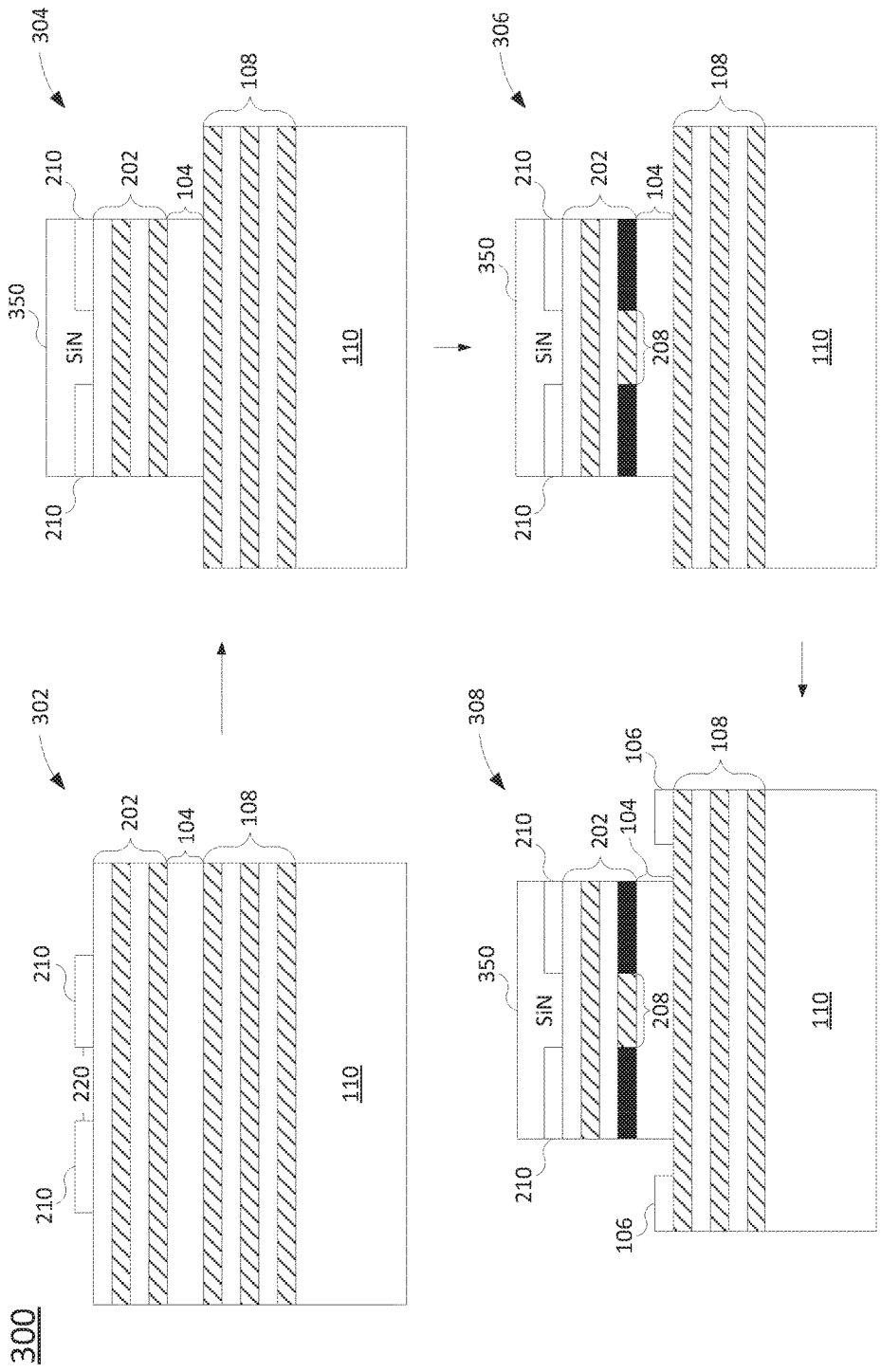

FIGS. 3A and 3B illustrate an example schematic process flow 300 for fabricating the VCSEL 100. Beginning with FIG. 3A at block 302, a p-ohmic contact layer 210 is applied on a substrate 110 having a p-DBR layer 202, a laser cavity layer 104 and an n-DBR layer 108. In some implementations, the p-DBR layer 202, the laser cavity layer 104 and the n-DBR layer 108 may be grown on the substrate 110 using a metal organic chemical vapor deposition (MOCVD) process or a molecular beam epitaxy (MBE) process.

In one example, the last layer on top of the substrate 110 (e.g., the top most layer of the p-DBR layer 202) may be a material with a low band gap and that can make a good ohmic contact to the metal in the p-ohmic contact layer 210. For example, for a GaAs substrate, the last layer that contacts the p-ohmic contact layer 210 may be a layer of heavily p-type doped GaAs.

The p-ohmic contact layer 210 may be applied via electron beam evaporation, a sputtering process, an electroplating process, or any other metal application process. The p-ohmic contact layer 210 may be patterned to have an opening 220.

At block 304, a mask, lithography and etching process may be applied to create a "mesa" that includes the p-DBR layer 202. For example, a SiN mask 350 may be applied, patterned with a photoresist and lithography process and etched with a dry etch process. The "mesa" is illustrated in block 304 as portions of the patterned SiN mask 350, the p-DBR layer 202 and the laser cavity layer 104 after they are removed or etched away.

At block 306, a wet oxidation process may be selectively applied to the mesa to form an oxide aperture 208 that is aligned with the opening of the p-ohmic contact layer. As described above, the low refractive index layers 204 may have a higher oxidation rate than the high refractive index layers 206. The wet oxidation process may oxidize the p-DBR layer 202 from an outside or periphery of the p-DBR layer 202 and inward towards a center of the p-DBR layer. The wet oxidation process may be controlled to oxidize the low refractive index layers 204 until the oxide aperture 208 is created. The oxide aperture 208 may have a much higher Al concentration compared to the other layers in the p-DBR layer 202. For example, the oxide aperture layer may be composed of AlGaAs with 98% Al.

It should be noted that only a single oxide aperture 208 is illustrated in FIG. 3 for ease of explanation. However, as described above with reference to FIG. 2, an oxide aperture 208 may be created in multiple 98% Al layers that undergoes the wet oxidation process. In other words, if there are 10 98% Ai layers, then there would be 10 oxide apertures 208 in the p-DBR layer 202.

At block 308, the n-ohmic contact layers 106 may be added. For example, the n-ohmic contact layer 106 may be added adjacent to the top most layer of the n-DBR layer 108. The n-ohmic contact layer 106 may be added using: electron beam evaporation, a sputtering process, electro plating process, or any other metal application process.

Moving to FIG. 3B at block 310, the SiN mask 350 may be removed and the dielectric material 212 may be added to fill the opening in the p-ohmic contact layer 210. In one example, the dielectric layer 212 may be added using a plasma enhanced chemical vapor deposition (PECVD) process, electron beam evaporation, sputtering, atomic layer deposition, spin coating, and the like. A lithography and etch step may be used to selectively etch away the excess dielectric material 212 on undesirable locations.

At block 312, the dielectric material 212 may be encapsulated with a metal layer 214 coupled to the p-ohmic contact layer 210. The metal layer 214 may be added via electron beam evaporation, sputtering, a thermal evaporation, electro-plating, or any other metal application process. The metal layer 214 may completely seal the dielectric material 212 from the outside environment.

In one example, the metal layer 214 may include a metal that adheres well to a top most metal layer of the p-ohmic contact layer 210. In some implementations, a diffusion barrier may be added between the metal layer 214 and the p-ohmic contact layer 210 that contacts the metal layer 214, At block 314, the VCSEL structure may be placarded. For example, a polyimide or a benzo-cyclo-butane (BCB) 352 may be applied to planarize the surface topography. Vias may be created by patterning vias in the polyimide or BCB 352 by lithography or etching the p-ohmic contact layer 210 and the n-ohmic contact layer 106.

At block 316, pads and interconnect metals 354 may be added over the polyimide or the BCB 352, and coupled to the p-ohmic contact layer 210 and the n-ohmic contact layer 106. The pads and the interconnect metals 354 may include metals such as Ti, Pt or Au.

Figure 4:
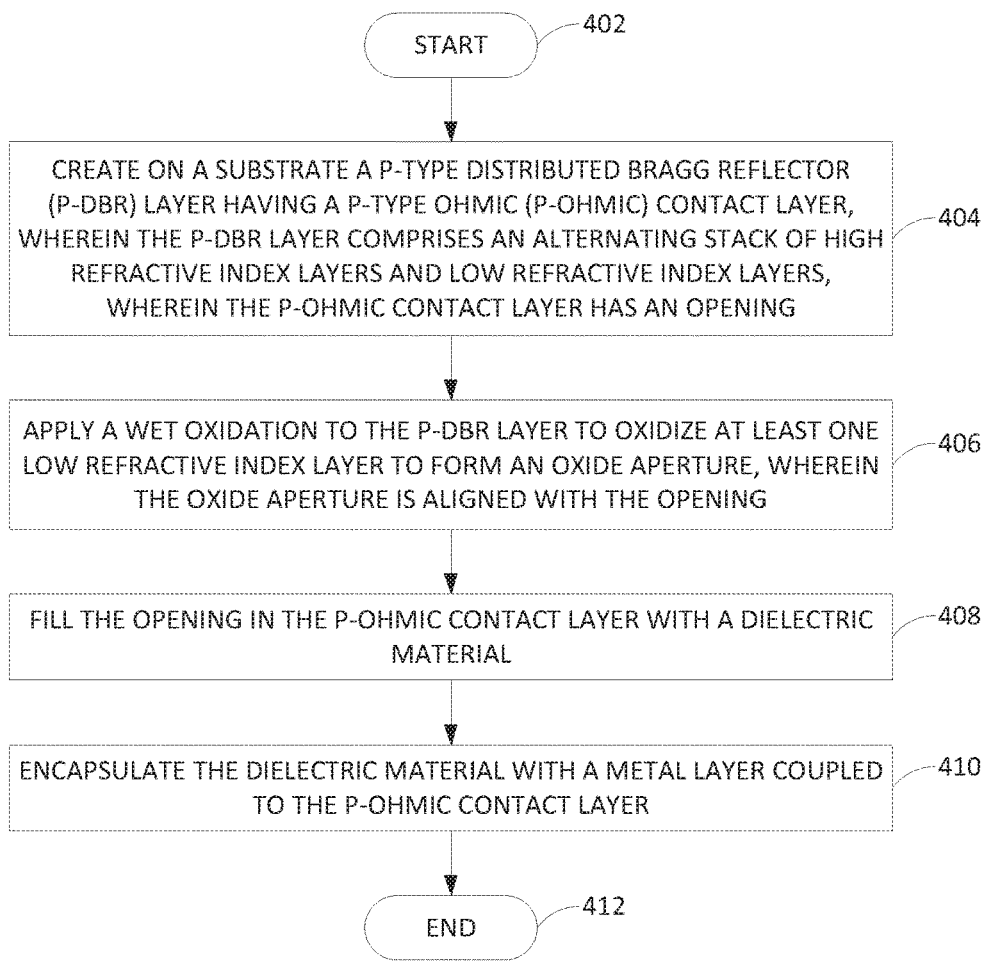
FIG. 4 is a flowchart of an example method for fabricating the example VCSEL of the present disclosure.

FIG. 4 illustrates an example flowchart of another method 400 for fabricating the VCSEL 100. In one example, the method 400 may be performed in a wafer fabrication plant using a plurality of different automated tools (e.g., CVD tools, wet etch tools, dry etch tools, ion implantation tools, sputtering tools, wet oxidation tools, and the like) to perform the different process described.

At block 402 the method 400 begins. At block 404, the method 400 creates on a substrate a p-DBR layer having a p-ohmic contact layer, wherein the p-DBR layer comprises an alternating stack of a high refractive index layer and a low refractive index layer, wherein the p-ohmic contact layer has an opening. In one example, the p-DBR layer may be a thin p-DBR layer. In one example, "thin" may be defined as having less than 30 layers.

In some examples, where a GaAs substrate is used, the high refractive index layer and the low refractive index layer may include AlGaAs with high and low Al concentration, respectively. In one example, a high concentration may be defined as greater than 90% Al. In another example, a high concentration may be defined as approximately 92% or 98% Al. In some examples, the low concentration may be defined as less than 12% Al. In another example, a low concentration may be defined as 0% Al. In other examples, if an InP substrate is used, the layers may alternate between different high and low refractive index layers such as InAlGaAs and InP, respectively.

In some implementations, an n-DBR layer may de created. The n-DBR layer may comprise alternating layers of a high refractive index layer and a low refractive index layer similar to the p-DBR layer in addition, a laser cavity layer adjacent to the n-DBR layer and the p-DBR layer may be created in the substrate. The laser cavity layer may be comprised of multiple quantum wells.

At block 406, the method 400 applies a wet oxidation to the p-DBR layer to oxidize at least one low refractive index layer to form an oxide aperture, wherein the oxide aperture is aligned with the opening. The wet oxidation process may selectively oxidize the at least one low refractive index layer of the p-DBR layer to form the oxide aperture. In one example, the at least one low refractive index layer may be the low refractive index layers that have a higher or highest Al concentration (e.g., an AlGaAs layer with 98% Al). The wet oxidation process may oxidize the p-DBR layer from an outside-in direction. In other words, the wet oxidation begins oxidation on the outside of the p-DBR layer and oxidizes the high Ai concentration layer gradually inward, or along a direction of the high Al concentration layer, towards a center of the p-DBR layer.

At block 408, the method fills the opening in the p-ohmic contact layer with a dielectric material. The dielectric material may be any material that has a refractive index less than 2. In one example, the dielectric material may be electrically insulating and optically transparent oxides and nitrides. Some examples of oxides or nitrides that may be used as the dielectric material may include silicon dioxide ($SiO_2$) and silicon nitride ($Si_3N_4$). Alternatively, the dielectric material may be any transparent conducive material that allows light to pass, but is also electrically conductive, such as transparent conductive oxides and nitrides.

In one example, the thickness of the dielectric material may be a function of the lasting wavelength of the VCSEL. For example, the thickness of the dielectric material may be approximately one quarter of a wavelength of the VCSEL, Mathematically, the thickness may be expressed as thickness~a lasing wavelength/($4*n\_dielectric$ material) where n_dielectric material represents a refractive index of the dielectric material.

At block 410, the method 400 encapsulates the dielectric material with a metal layer coupled to the p-ohmic contact layer. The metal layer may completely seal the dielectric material from the outside environment. In one example, the metal layer may include a metal that adheres well to a top most metal layer of the p-ohmic contact layer.

In some implementations, the VCSEL structure may also be planarized by adding a polyimide or BCB. Vias in the p-ohmic contact and the n-ohmic contact layers may be patterned into the polyimide or BCB. In addition, pad and interconnect metals coupled to the p-ohmic contact layer and the n-ohmic contact layer may be added over the polyimide or BCB. At block 412, the method 400 ends.

It will be appreciated that variants of the above-disclosed and other features and functions, or alternatives thereof, may be combined into many other different systems or applications. Various presently unforeseen or unanticipated alternatives, modifications, or variations, therein may be subsequently made which are also intended to be encompassed by the following claims.

The invention claimed is:

1. A vertical-cavity surface-emitting laser (VCSEL), comprising:

a p-type distributed Bragg reflector (p-DBR) layer, wherein the p-DBR layer comprises an oxide aperture;

a p-type ohmic (p-ohmic) contact layer adjacent to the p-DBR layer, wherein the p-ohmic contact layer has an opening aligned with the oxide aperture;

a dielectric material filling the opening; and a metal layer encapsulating the dielectric material, wherein the metal layer is coupled to the p-ohmic contact layer.

2. The VCSEL of claim 1, wherein the p-DBR layer comprises a stack of less than 30 alternating layers of a high concentration of aluminum (Al) in an aluminum gallium arsenide (AlGaAs) layer and a low concentration of Al in an AlGaAs layer.

3. The VCSEL of claim 2, wherein the high concentration of Al comprises 92% or greater and the low concentration of Al comprises 12% or less.

4. The VCSEL of claim 1, wherein the dielectric material comprises a material having a refractive index less than 2.

5. The VCSEL of claim 1, wherein the metal layer is patterned to enhance a reflectivity of a particular polarization of light.

6. The VCSEL of claim 5, wherein the metal layer is patterned as a wire grid polarizer.

7. The VCSEL of claim 1, wherein the metal layer comprises a metal that bonds to a top metal layer of the p-ohmic contact layer.

8. The VCSEL of claim 1, further comprising:

a diffusion barrier between the p-ohmic contact layer and the metal layer.

* * * * *